United States Patent
Kim

(10) Patent No.: US 8,890,182 B2
(45) Date of Patent: Nov. 18, 2014

(54) LIGHT EMITTING DEVICE, LIGHT EMITTING DEVICE PACKAGE

(71) Applicant: LG Innotek Co., Ltd., Seoul (KR)

(72) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/935,298

(22) Filed: Jul. 3, 2013

(65) Prior Publication Data

US 2013/0292730 A1 Nov. 7, 2013

Related U.S. Application Data

(62) Division of application No. 13/017,872, filed on Jan. 31, 2011, now abandoned.

(30) Foreign Application Priority Data

Feb. 1, 2010 (KR) .................. 10-2010-0009210

(51) Int. Cl.
*H01L 29/205* (2006.01)
*H01L 33/58* (2010.01)
*H01L 33/20* (2010.01)
*H01L 33/38* (2010.01)

(52) U.S. Cl.
CPC ............... *H01L 33/58* (2013.01); *H01L 33/387* (2013.01); *H01L 33/20* (2013.01); *H01L 2933/0083* (2013.01)
USPC .................. 257/91; 257/95; 257/98

(58) Field of Classification Search
CPC ........ H01L 33/20; H01L 33/58; H01L 33/387

USPC .................................... 257/91, 95, 98
See application file for complete search history.

(56) References Cited

U.S. PATENT DOCUMENTS

| 4,995,043 | A | * | 2/1991 | Kuwata et al. ............ 372/7 |
| 5,813,752 | A | | 9/1998 | Singer et al. |
| 6,995,401 | B2 | * | 2/2006 | Yamada et al. ............ 257/79 |
| 7,652,295 | B2 | * | 1/2010 | Cho et al. ............ 257/79 |
| 7,781,791 | B2 | | 8/2010 | Sakai et al. |
| 2004/0184498 | A1 | * | 9/2004 | Ueki ............ 372/45 |
| 2004/0206969 | A1 | | 10/2004 | Orita |
| 2005/0236636 | A1 | * | 10/2005 | Hon et al. ............ 257/99 |

(Continued)

FOREIGN PATENT DOCUMENTS

| CN | 101615648 A | 12/2009 |
| JP | 12-515689 | 11/2000 |

(Continued)

*Primary Examiner* — Trung Q Dang
(74) *Attorney, Agent, or Firm* — McKenna Long & Aldridge LLP

(57) ABSTRACT

Provided are a light emitting device, a light emitting device package, and a lighting system. The light emitting device includes a light emitting structure including a first conductive type semiconductor layer, a second conductive type semiconductor layer, and an active layer between the first conductive type semiconductor layer and the second conductive type semiconductor layer and a light extraction pattern in which a period (a) exceeds $\lambda/n$ (where, $\lambda$ is a wavelength of light emitted from the active layer, and n is a refractive index of the light emitting structure) on the light emitting structure. The period (a) may be in the range of $5\times(\lambda/n) < a < 15\times(\lambda/n)$. An etching depth (h) of the light extraction pattern may be equal to or greater than $\lambda/n$.

20 Claims, 6 Drawing Sheets

(56) References Cited

U.S. PATENT DOCUMENTS

| | | |
|---|---|---|
| 2006/0225644 A1 | 10/2006 | Lee et al. |
| 2007/0018186 A1 | 1/2007 | Shin et al. |
| 2009/0108279 A1 | 4/2009 | Kim |
| 2009/0127567 A1 | 5/2009 | Wang |
| 2009/0267048 A1 | 10/2009 | Nakahara |
| 2009/0315054 A1 | 12/2009 | Kim et al. |
| 2012/0199864 A1 | 8/2012 | Kim |

FOREIGN PATENT DOCUMENTS

| | | |
|---|---|---|
| JP | 2003-279914 | 10/2003 |
| JP | 2007-088273 | 4/2007 |
| JP | 20-4645 | 1/2008 |
| JP | 2008-004645 | 1/2008 |
| KR | 10-0631981 B1 | 9/2006 |
| KR | 10-0639683 | 10/2006 |
| KR | 10-2008-0076429 A | 8/2008 |
| KR | 10-0896583 | 8/2008 |
| KR | 10-2008-0087175 A | 9/2008 |
| KR | 10-2009-0071088 A | 7/2009 |
| KR | 10-2009-0074359 A | 7/2009 |
| WO | 2009/093845 A2 | 7/2009 |

* cited by examiner

LIGHT EMITTING DEVICE, LIGHT EMITTING DEVICE PACKAGE

CROSS-REFERENCE TO RELATED APPLICATIONS

This application is a divisional of U.S. patent application Ser. No. 13/017,872 filed Jan. 31, 2011 and claims priority under 35 U.S.C. §119 to Korean Patent Application No. 10-2010-0009210 Filed Feb. 1, 2010, which is hereby incorporated by reference for all purposes as if fully set forth herein.

BACKGROUND OF THE INVENTION

Embodiments relate to a light emitting device, a light emitting device package, and a lighting system.

In light emitting devices, P-N junction diodes having the properties of converting electrical energy into light energy may be formed by combining group III and V elements on the periodic table. Light emitting devices may realize various colors by controlling the composition ratio of compound semiconductors.

A white LED may be realized by mixing R, G, B independent light sources with each other or converting a phosphor through a pump beam of blue or ultraviolet light. Here, the conversion of the phosphor has advantages in aspects of manufacturing cost, color temperature control, and light emitting efficiency. When the white LED is realized using the phosphor, a portion of the original blue light or UV is not absorbed into the phosphor, but is extracted to the outside. The other portion of the light is combined with the phosphor to generate color light having a longer wavelength than that of the original light.

According to related art, when a phosphor is mixed with an encapsulant to coat the mixture or a package structure is provided in which the encapsulant surrounds the phosphor, a portion of light may reenter into an LED chip because of a refractive index difference between the encapsulant and air (that is a final observation medium).

Also, because the light converted by the phosphor generates light in all directions by a self-emitting process, a portion of the light may essentially reenter into the LED chip.

A light extraction structure, which is provided on a surface of the chip to improve light extraction efficiency, may increase an amount of reentering light. Thus, the generated light may reenter into the chip to lose a portion of the light due to absorption loss within the chip. Accordingly, the light emitting efficiency may be reduced, and the reliability within the chip may be degraded.

SUMMARY OF THE INVENTION

Exemplary embodiments provide a light emitting device in which efficiency and reliability of a white LED can be improved, a light emitting device package, and a lighting system.

Embodiments provide a light emitting device, which can obtain an optimized light amount, a light emitting device package, and a lighting system.

In one embodiment, a light emitting device includes: a light emitting structure including a first conductive type semiconductor layer, a second conductive type semiconductor layer, and an active layer between the first conductive type semiconductor layer and the second conductive type semiconductor layer; and a light extraction pattern in which a period (a) exceeds $\lambda/n$ (where, $\lambda$ is a wavelength of light emitted from the active layer, and n is a refractive index of the light emitting structure) on the light emitting structure, wherein the period (a) may be in the range of $5\times(\lambda/n) \langle a \langle 15\times(\lambda/n)$ and an etching depth (h) of the light extraction pattern may be equal to or greater than $\lambda/n$.

In another embodiment, a light emitting device includes: a light emitting structure including a first conductive type semiconductor layer, a second conductive type semiconductor layer, and an active layer between the first conductive type semiconductor layer and the second conductive type semiconductor layer; and a light extraction pattern in which a period (a) exceeds $\lambda/n$ (where, $\lambda$ is a wavelength of light emitted from the active layer, and n is a refractive index of the light emitting structure) on the light emitting structure, wherein the light extraction pattern prevents light generated in the light emitting structure from reentering into the light emitting structure.

In further another embodiment, a light emitting device includes: a light emitting structure including a first conductive type semiconductor layer, a second conductive type semiconductor layer, and an active layer between the first conductive type semiconductor layer and the second conductive type semiconductor layer; a second electrode layer supporting the light emitting structure; and a light extraction pattern in which a period (a) exceeds $\lambda/n$ (where, $\lambda$ is a wavelength of light emitted from the active layer, and n is a refractive index of the light emitting structure) in the second electrode layer, wherein the light extraction pattern is disposed within the second electrode layer, contacts the light emitting structure, and is not exposed to the outside of the second electrode layer.

In still further another embodiment, a light emitting device package includes: a light emitting device; and a package body in which the light emitting device is disposed.

In yet further another embodiment, a lighting system includes: a board; and a light emitting device package, the light emitting device being disposed on the board.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package, and a lighting system according to exemplary embodiments will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
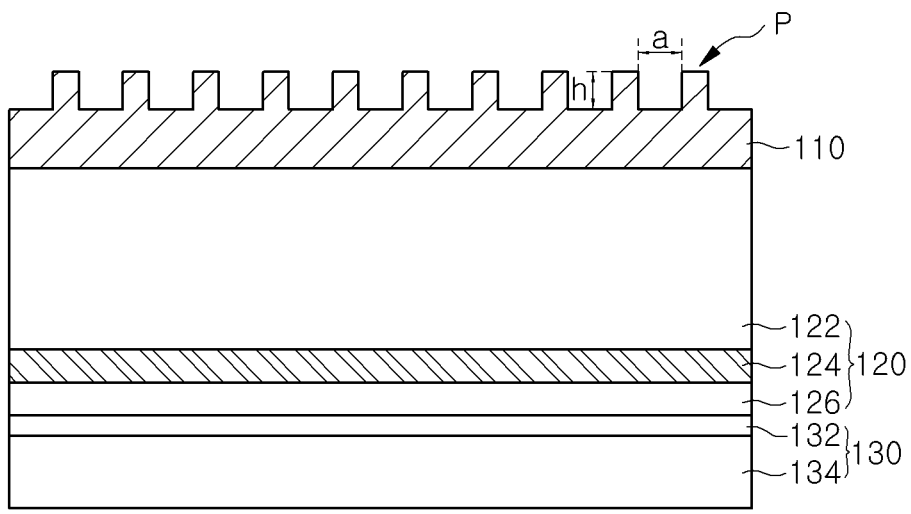
FIG. 1 is a sectional view of a light emitting device according to a first exemplary embodiment.

FIG. 1 is a sectional view of a light emitting device according to a first exemplary embodiment.

A light emitting device 100 according to a first embodiment may include a light emitting structure 120 including a first conductive type semiconductor layer 122, an active layer 124, and a second conductive type semiconductor layer 126 and a light extraction pattern P in which a period (a) exceeds $\lambda/n$ (where, $\lambda$ is a wavelength of light emitted from the active layer 124, and n is a refractive index of the light emitting structure 120) on the light emitting structure 120.

Although the light extraction pattern P is disposed within the light emitting structure 120 in the current embodiment, the present disclosure is not limited thereto. For example, an undoped semiconductor layer 110 may be disposed on the light emitting structure 120, and the light extraction pattern P may be disposed on the undoped semiconductor layer 110. Alternatively, the light extraction pattern P may be disposed on the first conductive type semiconductor layer 122.

In the current embodiment, the light extraction pattern P may have an optical crystal structure, but is not limited thereto.

In the current embodiment, the period (a) may be in the range of $5 \times (\lambda/n) < a < 15 \times (\lambda/n)$.

Also, in the current embodiment, the light extraction pattern P may have an etching depth equal to or greater than $\lambda/n$.

The light emitting structure according to the current embodiment may prevent generated light from reentering into a chip to improve efficiency of a white LED.

In the current embodiment, the white LED may include a pump LED and a phosphor. Here, the pump LED may have a centroid wavelength less than that of the phosphor.

Figure 6:
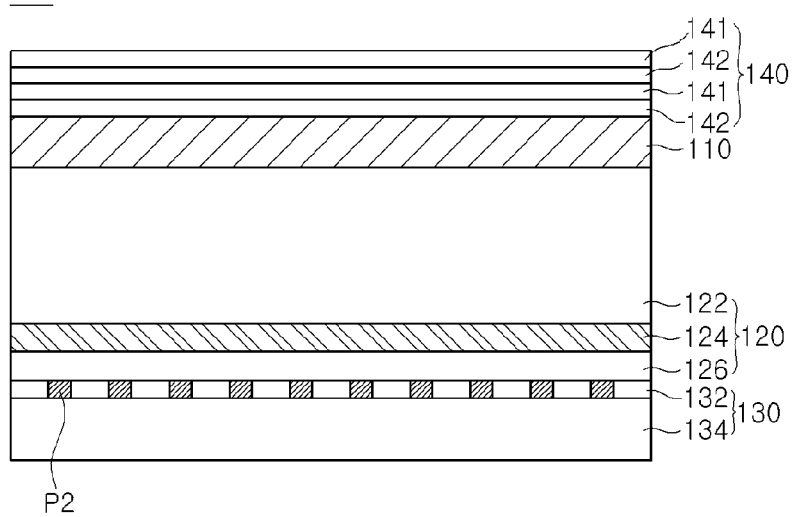
FIG. 6 is a sectional view of a light emitting device according to a second exemplary embodiment.

In the embodiment, the light extraction pattern P may be disposed on a top end of the chip with an adequate period as shown in FIG. 1 or disposed within the chip as shown in FIG. 6.

Figure 2A:
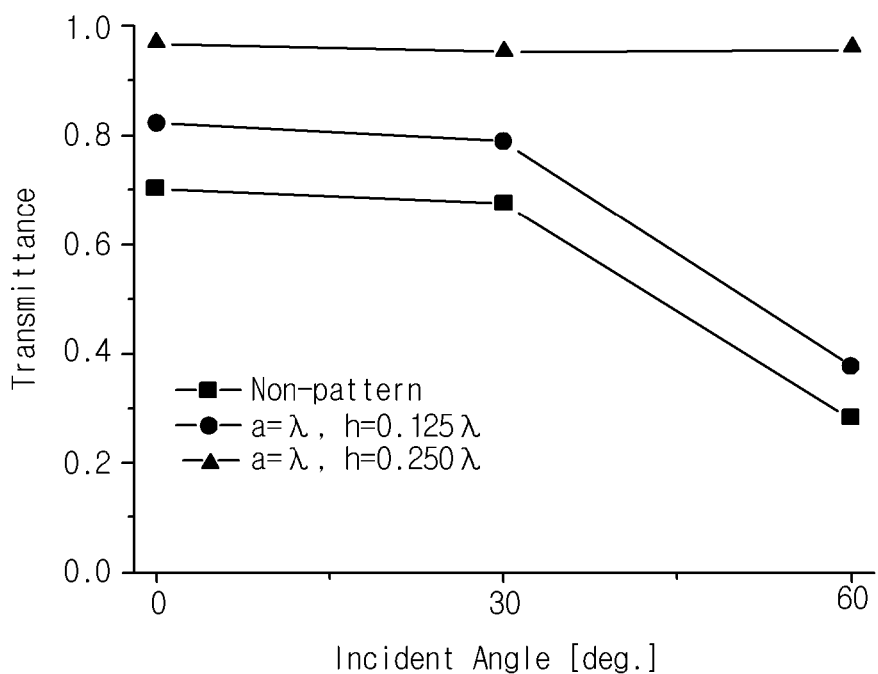
FIG. 2A is a graph illustrating an example of a transmittance variation according to an incident angle in a structure in which a light extraction structure is provided in an upper region of a light emitting device chip.

FIG. 2A is a graph illustrating an example of a transmittance variation according to an incident angle in a structure in which a light extraction structure is provided in an upper region of a light emitting device chip. Referring to FIG. 2A, in case where the light extraction structure is disposed on the top end of the chip, when light escaping already from the light extraction structure reaches again a surface of the top end of the chip, the light extraction structure may perform a role such as anti-reflection coating to increase transmittance into the chip when compared to a structure in which a pattern is not provided, thereby assisting the entry of the light.

Figure 2B:
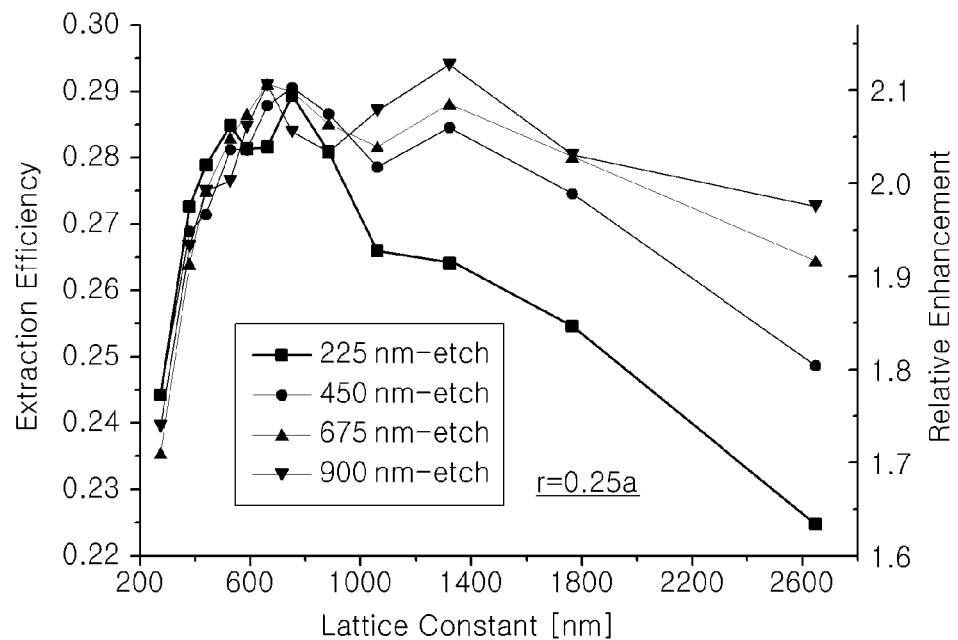
FIG. 2B is a graph illustrating light extraction efficiency according to an etching depth and period of a light emitting device according to an exemplary embodiment.

FIG. 2B is a graph illustrating light extraction efficiency according to an etching depth and period of a light emitting device according to an exemplary embodiment.

When the light extraction pattern P is disposed on the top end of the chip in the current embodiment, it may be possible to maintain light extraction efficiency within the chip and prevent the previously escaping light from reentering using an optical crystal structure in which a large lattice constant, e.g., the period (a) exceeds $\lambda/n$.

Here, as shown in FIG. 2B, the light extraction pattern P may have the period (a) within the range of $5 \times (\lambda/n) < a < 15 \times (\lambda/n)$. When the period (a) of the light extraction pattern P is less than the above-described range, the light extraction pattern P may perform an anti-reflection coating function against the reentering light to reduce light emitting efficiency. On the other hand, when the period (a) of the light extraction pattern P is greater that the above-described range, it may be difficult to diffract light within the chip to reduce the light extraction efficiency.

In FIG. 2B, a range of the period (a) that is defined as an X-axis may represent effective light extraction efficiency in the range of about 1,000 nm to about 2,800 nm. Here, when the period (a) is less than about 1,000 nm, the period (a) may be a small lattice constant and meaningful in the light extraction efficiency. However, when the period (a) is the small lattice constant, there may be a limitation that external transmittance of the previously escaping light is increased.

Also, as shown in FIG. 2B, when the etching depth h of the light extraction pattern P is equal to or greater than $\lambda/n$, the light extraction pattern P may have effective light extraction efficiency. For example, in case where the period (a) of the light extraction pattern P is in the range of $5 \times (\lambda/n) < a < 15 \times (\lambda/n)$, e.g., the period (a) of the light extraction pattern P may be in the range of about 1,000 nm to about 2,800 nm, when the etching depth h of the light extraction pattern P may be in the range of about 450 nm to about 900 nm, the light extraction pattern P may have the effective light extraction efficiency.

In the light emitting device according to the current embodiment, it may prevent light generated from the LED active layer and light converted by combining the generated light with the phosphor from reentering into the chip through a design of the light extraction pattern provided to the LED chip. Accordingly, efficiency and reliability of the white LED may be improved.

Hereinafter, a process of manufacturing the light emitting device according to the first embodiment will be described with reference to FIGS. 3 to 5.

Figure 3:
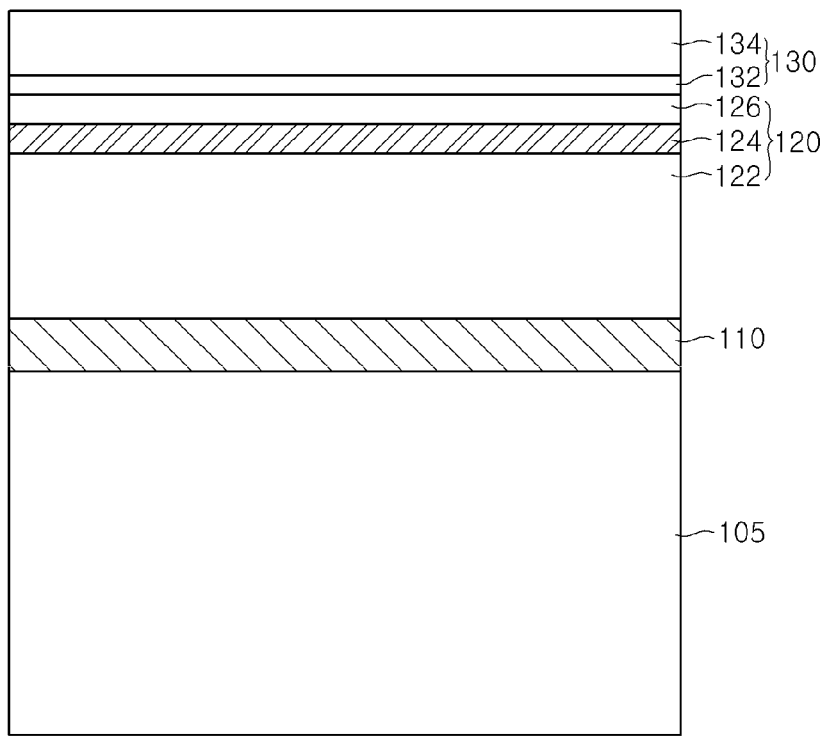
FIGS. 3 to 5 are sectional views illustrating a process of manufacturing the light emitting device according to the first exemplary embodiment.
Figure 4:
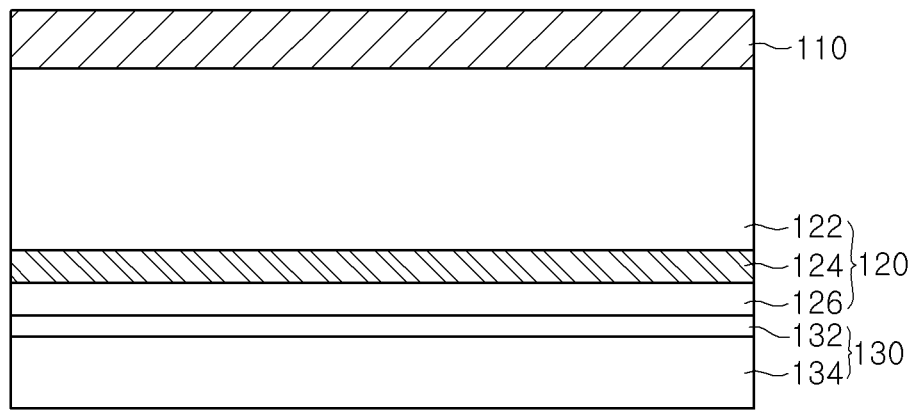

First, as shown in FIG. 3, a first substrate 105 is prepared.

The first substrate 105 may include a conductive substrate or an insulative substrate. For example, the first substrate may be formed of at least one of sapphire ($Al_2O_3$), SiC, GaAs, GaN, ZnO, Si, GaP, InP, Ge, and $Ga_2O_3$. A roughness structure may be formed on the first substrate, but is not limited thereto.

Thereafter, a light emitting structure 120 including a first conductive type semiconductor layer 122, an active layer 124, and a second conductive type semiconductor layer 126 may be formed on the first substrate 105.

For example, the light emitting structure 120 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer 110 may be formed on the first substrate 105. The buffer layer 110 may reduce a lattice mismatch between a material of the light emitting structure 120 and the first substrate 105. The buffer layer 110 may be formed of a group III-V compound semiconductor, e.g., at least one of GaN, InN, AlN, InGaN, AlGaN, InAlGaN, and AlInN. An undoped semiconductor layer may be formed on the buffer layer 110, but is not limited thereto.

The first conductive type semiconductor layer 122 may be formed of a group III-V compound semiconductor doped with a first conductive type dopant. When the first conductive type semiconductor layer 122 is an N-type semiconductor layer, the first conductive type dopant may include Si, Ge, Sn, Se, or Te as an N-type dopant, but is not limited thereto.

The first conductive type semiconductor layer 122 may be formed of a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 122 may be formed of one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 122 may form an N-type GaN layer using the CVD process, the MBE process, a sputtering process, or the HVPE process. Also, the first conductive type semiconductor layer 122 may be formed by injecting silane gas ($SiH_4$) containing n-type impurities such as trimethyl gallium (TMGa) gas, ammonia ($NH_3$) gas, nitrogen ($N_2$) gas, and silicon (Si).

The active layer 124 is a layer in which electrons injected through the first conductive type semiconductor layer 122 meet with holes injected through the second conductive type semiconductor layer 126 to emit light having energy determined by a proper energy band of the active layer (light emitting layer) material.

The active layer 124 may have at least one of a single quantum well structure, a multi quantum well (MQW) structure, a quantum-wire structure, and a quantum dot structure. For example, the active layer 124 may have the MQW structure by injecting trimethyl gallium (TMGa) gas, ammonia ($NH_3$) gas, nitrogen ($N_2$) gas, and trimethyl indium (TMIn) gas, but is not limited thereto.

A well layer/barrier layer of the active layer 124 may have a pair structure with at least one of InGaN/GaN, InGaN/InGaN, AlGaN/GaN, InAlGaN/GaN, GaAs(InGaAs)/AlGaAs, and GaP(InGaP)/AlGaP, but is not limited thereto. The well layer may be formed of a material having a band gap less than that of the barrier layer.

A conductive type clad layer may be formed on or/and under the active layer 124. The conductive type clad layer may be formed of an AlGaN-based semiconductor and have a band gap greater than that of the active layer 124.

The second conductive type semiconductor layer 126 may be formed of a group III-V compound semiconductor doped with a second conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). For example, the second conductive type semiconductor layer 126 may be formed of one of GaN, AlN, AlGaN, InGaN, InN, InAlGaN, AlInN, AlGaAs, GaP, GaAs, GaAsP, and AlGaInP. When the second conductive type semiconductor layer 126 is a P-type semiconductor layer, the second conductive type dopant may include Mg, Zn, Ca, Sr, or Ba as a P-type dopant. The second conductive type semiconductor layer 126 may have a single-layered or multi-layered structure, but is not limited thereto.

The second conductive type semiconductor layer 126 may form a P-type GaN layer by injecting trimethyl gallium (TMGa) gas, ammonia ($NH_3$) gas, nitrogen ($N_2$) gas, and trimethyl indium (TMIn) gas, and bis-ethyl-cyclopentadienyl-magnesium ($EtCp_2Mg$){$Mg(C_2H_5C_5H_4)_2$} containing P-type impurities such as magnesium (Mg) into a chamber, but is not limited thereto.

In the embodiment, the first conductive type semiconductor layer 122 may be realized as an N-type semiconductor layer, and the second conductive type semiconductor layer 126 may be realizes as a P-type semiconductor layer, but are not limited thereto. Also, a semiconductor layer having a polarity opposite to that of the second conductive type, e.g., an N-type semiconductor layer (not shown) may be formed on the second conductive type semiconductor layer 126. Thus, the light emitting structure 120 may have one of an N-P junction structure, a P-N junction structure, an N-P-N junction structure, and a P-N-P junction structure.

Thereafter, a second electrode layer 130 may be formed on the second conductive type semiconductor layer 126.

The second electrode layer 130 may include an ohmic layer 132, a reflective layer (not shown), an adhesion layer (not shown), and a conductive support layer 134.

For example, the second electrode layer 130 may include the ohmic layer 132. The ohmic layer 132 ohmic-contacts the light emitting structure 120 to smoothly supply a power to the light emitting structure 120. Also, the ohmic layer may be formed by multiply stacking a single metal or a metal alloy and a metal oxide.

For example, the ohmic layer 132 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited thereto.

The second electrode layer 130 may include the reflective layer (not shown) to reflect light incident from the light emitting structure 120, thereby improving the light extraction efficiency.

For example, the reflective layer may be formed of a metal or alloy including at least one of Ag, Ni, Al, Rh, Pd, Ir, Ru, Mg, Zn, Pt, Au, Hf. Also, the reflective layer may be formed in a multi-layered structure using the metal or alloy and a light-transmitting conductive material such as IZO, IZTO, IAZO, IGZO, IGTO, AZO, or ATO. For example, the reflective layer may have a stacked structure of IZO/Ni, AZO/Ag, IZO/Ag/Ni, or AZO/Ag/Ni.

When the second electrode layer 130 includes the adhesion layer, the reflective layer may serve as an adhesion layer or include a barrier metal or a bonding metal. For example, the adhesion layer may be formed of at least one of Ti, Au, Sn, Ni, Cr, Ga, In, Bi, Cu, Ag and Ta.

The second electrode layer 130 may include the conductive support substrate. The conductive support substrate 134 supports the light emitting structure 120 and provides a power to the light emitting structure 120. The conductive support substrate 134 may be formed of a metal, a metal alloy, or a conductive semiconductor material, which has superior conductivity.

For example, the conductive support substrate 134 may be formed of at least one of copper (Cu), a copper alloy, gold (Au), nickel (Ni), molybdenum (Mo), copper-tungsten (Cu—W), and a carrier wafer (e.g., Si, Ge, GaAs, GaN, ZnO, SiGe, or SiC).

The conductive support substrate 134 may have a thickness, which is varied according to the design of the light emitting device 120. For example, the conductive support substrate may have a thickness of about 30 μm to 500 μm.

A process of forming the conductive support substrate 134 may include an electrochemical metal deposition process, a plating process, and a bonding process using a eutectic metal.

Figure 5:
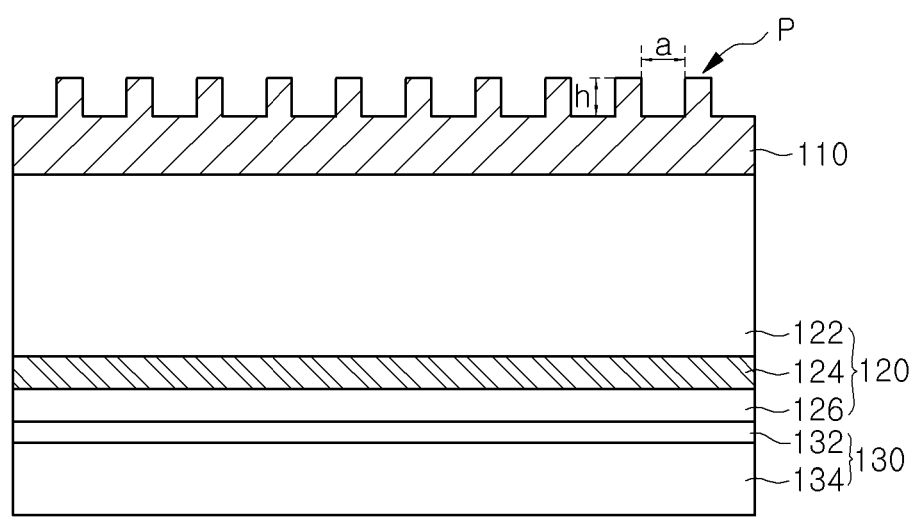

Next, as shown in FIG. 5, the first substrate 105 may be removed to expose the first conductive type semiconductor layer 122. The first substrate 105 may be removed using a laser lift off process or a chemical lift off process. Alternatively, the first substrate 105 may be removed through physical grinding.

Thereafter, as shown in FIG. 5, a light extraction pattern P may be formed on the undoped semiconductor layer 110, but is not limited thereto. When the undoped semiconductor layer 110 is not provided, the light extraction pattern P may be formed on the light emitting structure 120. For example, the light extraction pattern P may be formed on the first conductive type semiconductor layer 122.

When the light extraction pattern P is formed on a top end of a chip in the current embodiment, it may be possible to maintain light extraction efficiency within the chip and prevent previously escaping light from reentering using an optical crystal structure in which a large lattice constant, e.g., a period (a) exceeds $\lambda/n$.

Here, the light extraction pattern P may have the period (a) within the range of $5\times(\lambda/n) < a < 15\times(\lambda/n)$. When the period (a) of the light extraction pattern P is less than the above-described range, the light extraction pattern P may perform an anti-reflection coating function against the reentering light to reduce light emitting efficiency. On the other hand, when the period (a) of the light extraction pattern P is greater that the above-described range, it may be difficult to diffract light within the chip to reduce the light extraction efficiency.

A range of the period (a) of the light extraction pattern P may represent effective light extraction efficiency in the range of about 1,000 nm to about 2,800 nm. Here, when the period (a) is less than about 1,000 nm, the period (a) may be a small lattice constant and meaningful in the light extraction efficiency. However, when the period (a) is the small lattice constant, there may be a limitation that external transmittance of the previously escaping light is increased.

Also, when an etching depth h of the light extraction pattern P is equal to or greater than $\lambda/n$, the light extraction pattern P may have effective light extraction efficiency.

Thereafter, a pad (not shown) may be formed on the light emitting structure 120.

In the light emitting device according to the current embodiment, it may prevent light generated from the LED active layer and light converted by combining the generated light with the phosphor from reentering into the chip through a design of the light extraction pattern provided to the LED chip. Accordingly, efficiency and reliability of the white LED may be improved.

FIG. 6 is a sectional view of a light emitting device 102 according to a second exemplary embodiment.

A second embodiment may adopt the technical features of the first embodiment.

As shown in FIG. 6, a second electrode layer 130 may be disposed under a light emitting structure 120. A second light extraction pattern P2 may be disposed in the second electrode layer 130. The second light extraction pattern P2 may be a light extraction pattern (where, $\lambda$ is a wavelength of light emitted from an active layer, and n is a refractive index of a light emitting structure) in which a period (a) exceeds $\lambda/n$ within the second electrode layer 130. The second light extraction pattern P2 may be disposed within the second electrode layer 130 and contact the light emitting structure 120. Also, the second light extraction pattern P2 may not be exposed to the outside of the second electrode layer 130.

Also, as shown in FIG. 6, the second embodiment may include a wavelength filter 140 on the light emitting structure 120.

Also, in the second embodiment, an undoped semiconductor layer 110 may be selectively disposed between the light emitting structure 120 and the wavelength filter 140.

In case where the second light extraction pattern P2 is disposed on a chip, i.e., in a vertically type LED, the second light extraction pattern P2 may be inserted into an ohmic layer 132 or a reflective layer in a metal pattern or dielectric pattern shape, but is not limited thereto.

In case where a light extraction pattern is provided on a top end of the chip to improve light extraction efficiency of an LED chip, when light escaping already from a light extraction structure reaches a surface of the top end of the chip again, the light extraction structure may perform a role such as anti-reflection coating to assist the entry of the light into the chip.

Thus, when the light extraction structure is disposed within the chip, but disposed on the chip, a transmission phenomenon may be restricted. Here, when the second light extraction pattern disposed within the chip executes the same performance as that of the light extraction pattern disposed on the top end of the chip, light emitting efficiency may be improved. In actuality, the metal pattern or the dielectric pattern disposed on a lower end of the vertical type LED may improve light extraction efficiency as well as prevent light from reentering when a white LED is realized.

Also, as shown in FIG. 6, the current embodiment may include the wavelength filter 140 on the light emitting structure 120.

The wavelength filter 140 may include a first dielectric layer 141 having a first refractive index and a second dielectric layer 142 having a second refractive index different from the first refractive index and disposed on the first dielectric layer 141.

Each of the first dielectric layer 141 and the second dielectric layer 142 may have a thickness of $\lambda/(4n\times\cos\theta)$ (where, $\lambda$ is a wavelength of light, n is a refractive index of the dielectric layer, and $\theta$ is an incident angle of light with respect to a substrate).

According to the second embodiment, the selective wavelength filter 140 disposed between a light emitting device and a phosphor layer may have a structure in which a material having a low refractive index and a material having a high refractive index are stacked with each other. Thus, light having a short wavelength transmitted from the inside of the light emitting device to the outside may well pass through the wavelength filter 140. On the other hand, light having long wavelength converted from the phosphor may be re-reflected by the wavelength filter 140 to prevent the light from reentering into the light emitting device.

Also, since the second light extraction pattern P2 is disposed within the light emitting device in the current embodiment, the light emitting device may have a flat top surface on which the wavelength filter 140 is disposed. Thus, the wavelength filter 140 may be easily and uniformly formed on the top surface of the light emitting structure. Therefore, the functions of the wavelength filter may be properly executed.

In the light emitting device according to the second embodiment, the selective wavelength filter disposed between the light emitting device and the phosphor layer may transmit light having high energy such as blue visible light or ultraviolet rays. On the other hand, the selective wavelength filter may reflect light having low energy excited from the phosphor to obtain an effective color rendering index.

In the light emitting device according to the embodiment, it may prevent light generated from an LED active layer and light converted by combining the generated light with the phosphor from reentering into the chip through a design of the light extraction pattern provided to the LED chip. Accordingly, efficiency and reliability of the white LED may be improved.

Figure 7:
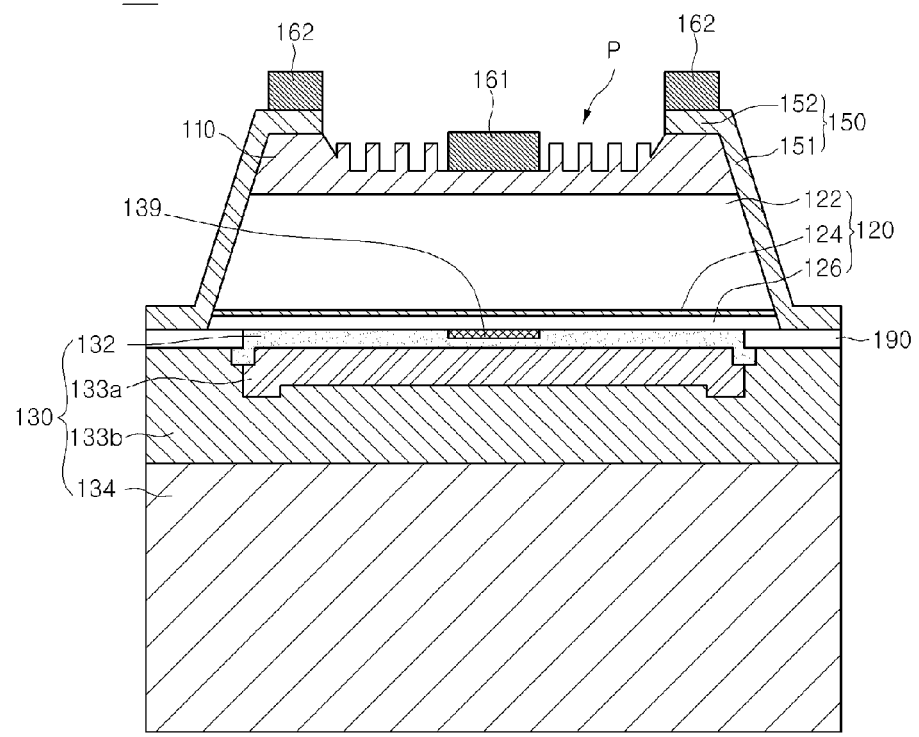
FIG. 7 is a sectional view of a light emitting device according to a third exemplary embodiment.

FIG. 7 is a sectional view of a light emitting device 103 according to a third exemplary embodiment.

A third embodiment may adopt the technical features of the second embodiment.

The light emitting device 103 according to the third embodiment may include a light emitting structure 120 including a first conductive type semiconductor layer 212, an active layer 214, and a second conductive type semiconductor layer 216, a first dielectric layer 151 on a portion of a top surface of the light emitting structure 120, and a pad electrode 162 on the first dielectric layer 151.

In the current embodiment, a dielectric layer 150 may include the first dielectric layer 151 and a second dielectric layer 152 on a side surface of the light emitting structure. The first dielectric layer 151 and the second dielectric layer 152 may be connected to each other.

The current embodiment may include a first electrode 161 on the light emitting structure 120. The pad electrode 162 may be electrically connected to the first electrode 161.

A light extraction pattern P in which a period (a) exceeds $\lambda/n$ (where, $\lambda$ is a wavelength of light emitted from the active layer 214, and n is a refractive index of the light emitting structure 120) may be disposed on the light emitting structure 120.

A second electrode layer 130 may be disposed under the light emitting structure 120. The second electrode layer 130 may include an ohmic layer 132, a reflective layer 133a, a coupling layer 133b, and a support substrate 134.

A protection member 190 may be disposed outside a lower side of the light emitting structure 120. A current blocking layer (CBL) 139 may be disposed between the light emitting structure 120 and the ohmic layer 132.

The protection member 190 may be disposed in a circumference region between the light emitting structure 120 and the coupling layer 133b. Thus, the protection member 190 has a ring shape, a loop shape, or a square frame shape. A portion of the protection member 190 may vertically overlap the light emitting structure 120.

The protection member 190 may increase a distance between side surfaces of the coupling layer 133b and the active layer 124 to prevent the coupling layer 133b and the active layer 124 from being electrically short-circuited to each other.

Also, the protection member 190 may prevent electrical short-circuits from occurring in a chip separation process.

The protection member 190 may be formed of an insulative material, a material having conductivity less than that of the reflective layer 133a or the coupling layer 133b, or a material, which forms schottky contact with the second conductive type semiconductor layer 126. For example, the protection member 190 may be formed of at least one of ITO, IZO, IZTO, IAZO, IGZO, IGTO, AZO, ATO, ZnO, SiO2, $SiO_x$, $SiO_xN_y$, $Si_3N_4$, $Al_2O_3$, $TiO_x$, $TiO_2$, Ti, Al, and Cr.

Figure 8:
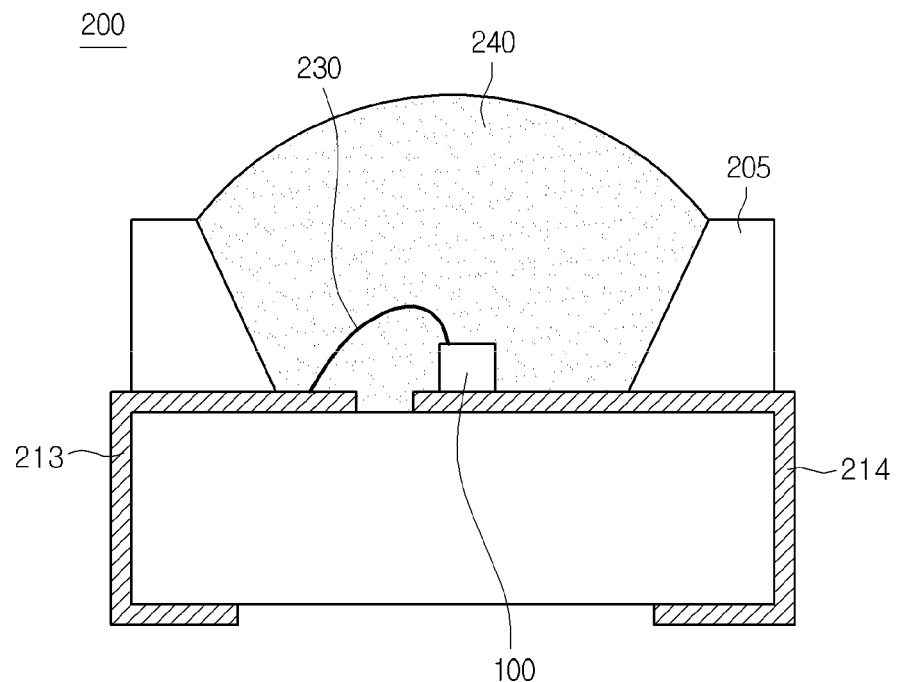
FIG. 8 is a sectional view of a light emitting device package according to an exemplary embodiment.

FIG. 8 is a sectional view of a light emitting device package 200 including the light emitting device according to the exemplary embodiments.

Referring to FIG. 8, a light emitting device package according to the embodiments includes a package body 205, a third electrode layer 213 and a fourth electrode layer 214 disposed on the package body 205, a light emitting device 100 disposed on the package body 205 and electrically connected to the third electrode layer 213 and the fourth electrode layer 214, and a molding member 240 surrounding the light emitting device 100.

The package body 205 may be formed of a silicon material, a synthetic resin material, or a metal material. An inclined surface may be disposed around the light emitting device 100.

The third electrode layer 213 and the fourth electrode layer 214 may be electrically separated from each other and supply power to the light emitting device 100. Also, the third electrode layer 213 and the fourth electrode layer 214 may reflect light generated in the light emitting device 100 to improve light efficiency, and may release heat generated in the light emitting device 100 to the outside.

The light emitting device 100 may be applicable to a vertical type light emitting device of FIG. 1, 6, or 7, but is not limited thereto.

The light emitting device 100 may be disposed on the package body 205 or on the third electrode layer 213 or the fourth electrode layer 214.

The light emitting device 100 may be electrically connected to the third electrode layer 213 or/and the fourth electrode layer 214 using one of a wire-bonding method, a flip-chip method, and a die bonding method. In the embodiment, the light emitting device 100 may be electrically connected to the third electrode layer 213 through a wire. Also, the light emitting device 100 may be directly contact the fourth electrode layer 214 and thus electrically connected to the fourth electrode layer 214.

The molding member 240 may surround the light emitting device 100 to protect the light emitting device 100. Also, the molding member 240 may include a phosphor to vary the wavelength of light emitted from the light emitting device 100.

A plurality of light emitting device packages according to the embodiments may be arrayed on a board. Also, optical members such as a light guide plate, a prism sheet, a diffusion sheet, and a fluorescence sheet may be disposed on a path of light emitted from the light emitting device packages. The light emitting device package, the board and the optical members may function as a backlight unit or lighting unit. For example, the lighting system may include a backlight unit, a lighting unit, an indicator unit, a lamp, a streetlamp, etc.

Figure 9:
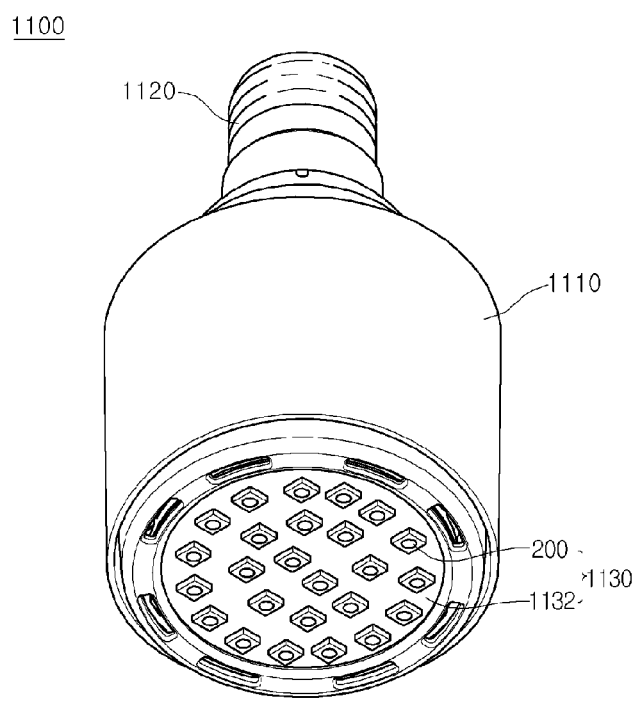
FIG. 9 is a perspective view of a lighting unit according to an exemplary embodiment.

FIG. 9 is a perspective view of a lighting unit according to an exemplary embodiment. The lighting unit 1100 shown in FIG. 9 is an example of the lighting system, but is not limited thereto.

Referring to FIG. 9, the lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a board 1132 and at least one light emitting device package 200 mounted on the board 1132.

A circuit pattern may be printed on an insulator to form the board 1132. For example, the board 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The light emitting device package 200 may be mounted on the board 1132. The light emitting device package 200 may include at least one light emitting diode (LED) 100. The light emitting diode 100 may include a colored light emitting diode that emits red, green, blue, or white light, and an UV light emitting diode that emits ultraviolet (UV) rays.

The light emitting module 1130 may include a plurality of light emitting device packages 200 to obtain various colors and brightness. For example, a white light emitting device, a red light emitting device, and a green light emitting device may be disposed in combination with each other to secure a high color rendering index (CRI).

The connection terminal 1120 may be electrically connected to the light emitting module 1130 to supply a power. As shown in FIG. 11, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

Figure 10:
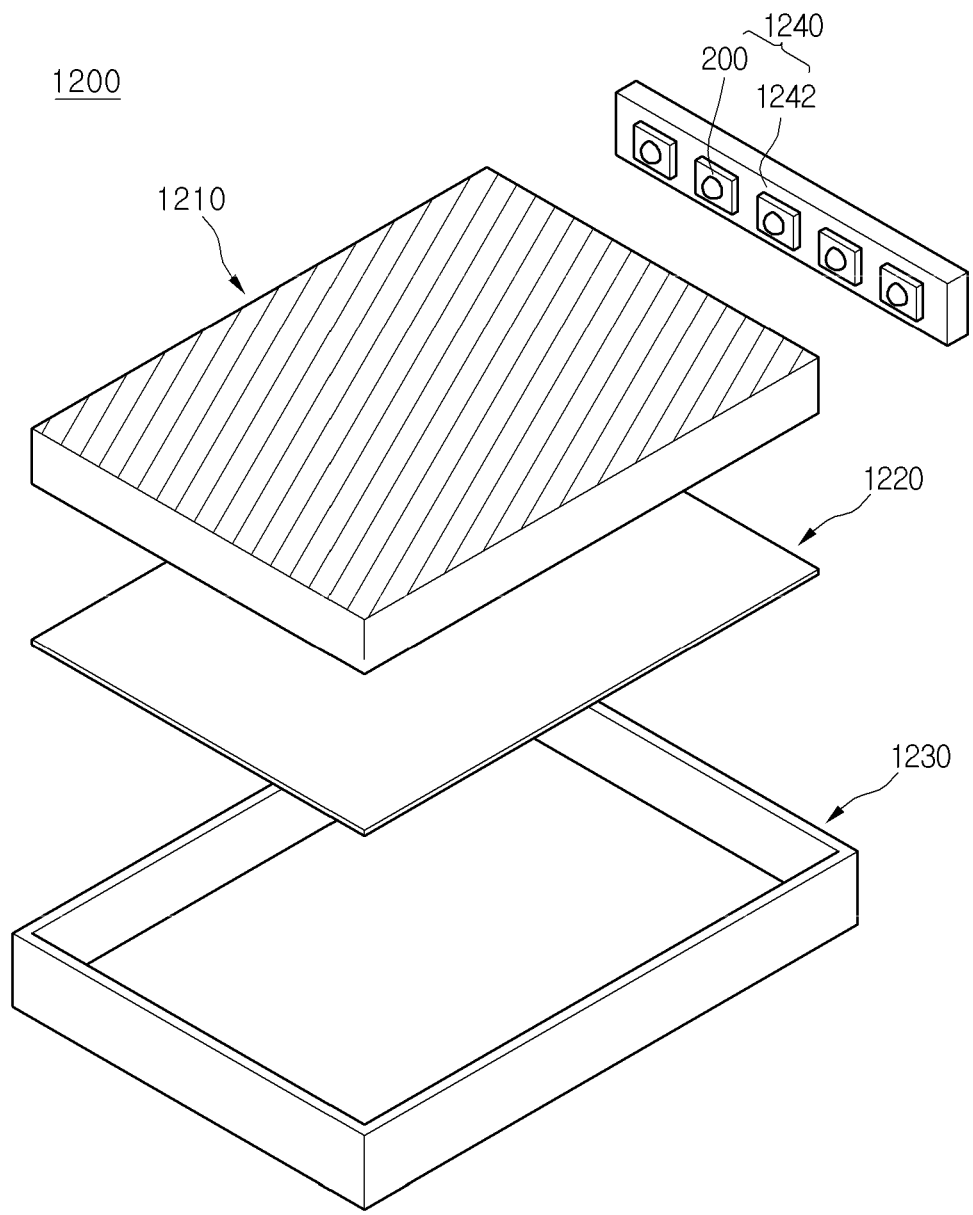
FIG. 10 is an exploded perspective view of a backlight unit according to an exemplary embodiment.

FIG. 10 is an exploded perspective view of a backlight unit according to an embodiment. The backlight unit 1200 shown in FIG. 10 is an example of the lighting system, but is not limited thereto.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 may diffuse light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of LIGHT EMITTING DEVICE packages 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The light emitting device packages 200 may have light emitting surfaces that emit light on the substrate 1242 and are spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

As described above, the lighting system according to the exemplary embodiments may include the light emitting device package according to the embodiments to improve the reliability.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure comprising a first conductive type semiconductor layer, a second conductive type semiconductor layer, and an active layer between the first conductive type semiconductor layer and the second conductive type semiconductor layer;
a second electrode layer under the light emitting structure; and
at least one light extraction pattern in the second electrode layer,
wherein the at least one light extraction pattern is disposed within the second electrode layer,
wherein the second electrode layer comprises an ohmic layer and a support substrate,
wherein the ohmic layer is disposed between the at least one light extraction pattern, and
wherein the support substrate is disposed under the ohmic layer and the at least one light extraction pattern.

2. The light emitting device of claim 1, wherein a top surface of the at least one light extraction pattern is flush with a top surface of the second electrode layer.

3. The light emitting device of claim 1, wherein the at least one light extraction pattern comprises an optical crystal structure.

4. The light emitting device of claim 1, wherein the at least one light extraction pattern physically contacts a bottom surface of the light emitting structure.

5. The light emitting device of claim 1, wherein a period (a) of the at least one light extraction pattern exceeds $\lambda/n$ (where, λ is a wavelength of light emitted from the active layer, and n is a refractive index of the light emitting structure).

6. The light emitting device of claim 5, wherein the period (a) is in the range of $5\times(\lambda/n)<a<15\times(\lambda/n)$.

7. The light emitting device of claim 5, wherein the period (a) of the at least one light extraction pattern is in the range of about 1,000 nm to about 2,800 nm.

8. The light emitting device of claim 1, wherein a depth of the at least one light extraction pattern is equal to or greater than $\lambda/n$.

9. The light emitting device of claim 8, wherein the depth of the at least one light extraction pattern is in the range of about 450 nm to about 900 nm.

10. The light emitting device of claim 1, further comprising a wavelength filter on the light emitting structure.

11. The light emitting device of claim 10, wherein the wavelength filter comprises a first dielectric layer having a first refractive index and a second dielectric layer having a second refractive index different from the first refractive index.

12. The light emitting device of claim 11, wherein the second dielectric layer is stacked on the first dielectric layer, and the first refractive index is less than the second refractive index.

13. The light emitting device of claim 10, further comprising an undoped semiconductor layer inter-disposed between the wavelength filter and the light emitting structure.

14. The light emitting device of claim 10, wherein the wavelength filter overlaps with the at least one light extraction pattern.

15. The light emitting device of claim 1, wherein the light extraction pattern comprises a dielectric pattern.

16. The light emitting device of claim 1, wherein the support substrate is directly in contact with both the ohmic layer and the at least one light extraction pattern.

17. The light emitting device of claim 1, wherein a thickness of the light extraction pattern is substantially the same as a total thickness of the ohmic layer.

18. A light emitting device comprising:
a light emitting structure comprising a first conductive type semiconductor layer, a second conductive type semiconductor layer, and an active layer between the first conductive type semiconductor layer and the second conductive type semiconductor layer;
a second electrode layer under the light emitting structure; and
at least one light extraction pattern in the second electrode layer,
wherein the at least one light extraction pattern is disposed within the second electrode layer,
wherein the second electrode layer comprises an ohmic layer and a support substrate,
wherein the ohmic layer is disposed between the at least one light extraction pattern, and
wherein the support substrate is a non-light transmissive layer,
wherein the at least one light extraction pattern is a non-conductive layer.

19. The light emitting device of claim 18, wherein the ohmic layer does not comprise a portion which is overlapped with the at least one light extraction pattern.

20. The light emitting device of claim 18, wherein a width of the support substrate is substantially the same as a width of the light emitting structure.

\* \* \* \* \*